US006617609B2

(12) United States Patent
Kelley et al.

(10) Patent No.: US 6,617,609 B2
(45) Date of Patent: Sep. 9, 2003

(54) ORGANIC THIN FILM TRANSISTOR WITH SILOXANE POLYMER INTERFACE

(75) Inventors: Tommie W. Kelley, Coon Rapids, MN (US); Larry D. Boardman, Woodbury, MN (US); Timothy D. Dunbar, Woodbury, MN (US); Todd D. Jones, St. Paul, MN (US); Dawn V. Muyres, St. Paul, MN (US); Mark J. Pellerite, Woodbury, MN (US); Terrance P. Smith, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/012,655

(22) Filed: Nov. 5, 2001

(65) Prior Publication Data

US 2003/0102472 A1 Jun. 5, 2003

(51) Int. Cl.$^7$ .............................................. H01L 51/00
(52) U.S. Cl. .......................... 257/40; 257/411; 438/99; 438/281
(58) Field of Search .................. 257/40, 288, 289, 257/411; 438/99, 151, 158, 287

(56) References Cited

U.S. PATENT DOCUMENTS

| | | | | |
|---|---|---|---|---|
| 5,017,975 A | * | 5/1991 | Ogawa | ........................... 357/8 |
| 5,079,179 A | | 1/1992 | Josefowicz et al. | |
| 5,266,222 A | * | 11/1993 | Willis et al. | ............ 252/49.006 |
| 5,324,543 A | * | 6/1994 | Ogawa et al. | ............... 427/387 |
| 5,347,144 A | | 9/1994 | Garnier et al. | |
| 5,625,199 A | | 4/1997 | Baumbach et al. | |
| 5,965,679 A | | 10/1999 | Godschalx et al. | |
| 6,060,338 A | * | 5/2000 | Tanaka et al. | ................. 438/99 |
| 6,252,245 B1 | | 6/2001 | Katz et al. | |
| 6,265,243 B1 | | 7/2001 | Katz et al. | |
| 6,288,188 B1 | | 9/2001 | Godschalx et al. | |
| 6,326,640 B1 | | 12/2001 | Shi et al. | |

FOREIGN PATENT DOCUMENTS

EP          1 041 652 A2    10/2000

OTHER PUBLICATIONS

Gundlach et al., "Pentacene Organic Thin–Film Transistors—Molecular Ordering and Mobility", *IEEE Electron Device Letters,* vol. 18, No. 3, Mar. 1997, pp. 87–90.
Lin et al., "Pentacene–Based Organic Thin Film Transistors", *IEEE Transactions on Electron Devices,* vol. 44, No. 8, Aug. 1997, pp. 1325–1331.
Lin et al., "Stacked Pentacene Layer Organic Thin–Film Transistors with Improved Characteristics", *IEEE Electron Device Letters,* vol. 18, No. 12, Dec. 1997, pp. 606–608.
Drury et al., "Low–cost all–polymer integrated circuits", *Applied Physics Letters,* vol. 73, No. 1, Jul. 1998, pp. 108–110.
Klauk et al., "Pentacene Organic Thin–Film Transistors for Circuit and Display Applications", *IEEE Transactions on Electron Devices,* vol. 46, No. 6, Jun. 1999, pp. 1258–1263.
Gundlach et al., "High–Mobility, Low Voltage Organic Thin Film Transistors", 1999 International Electron Devices Meeting Technical Digest, Dec. 1999, pp. 111–114.
Bao, "Materials and Fabrication Needs for Low–Cost Organic Transistor Circuits", *Advanced Materials,* 2000.
Tate et al., "Anodization and Microcontact Printing on Electroless Silver: Solution–Based Fabrication Procedures for Low–Voltage Electronic Systems with Organic Active Components", *Langmuir,* 16, 2000, pp. 6054–6060.
Crone et al., "Large–scale complementary integrated circuits based on organic transistors", *Nature,* vol. 403, Feb. 2000, pp. 521–523.
Klauk et al., "Pentacene organic thin–film transistors and ICs", *Solid State Technology,* Mar. 2000, pp. 63–64, 66–67, 72, 75 and 77.
Klauk et al., "A reduced complexity process for organic thin film transistors", *Applied Physics Letters,* vol. 76, No. 13, Mar. 2000, pp. 1692–1693.
Rogers et al., "Organic Smart Pixels and Complementary Inverter Circuits Formed on Plasic Substrates by Casting and Rubber Stamping", *IEEE Electron Devices Letters,* vol. 21, No. 3, Mar. 2000, pp. 100–103.
Kane et al., "Analog and Digital Circuits Using Organic Thin–Film Transistors on Polyester Substrates", *IEEE Electron Device Letters,* vol. 21, No. 11, Nov. 2000, pp. 534–536.
Gundlach et al., "Improved Organic Thin Film Transistor Performance Using Chemically–Modified Gate Dielectrics", Proc.SPIE, vol. 4466, 2001, pp. 54–64.
Marshall, "Welcome to Plastic Valley", *Business 2.0,* Jan. 2001, 3 pages.
Meyer zu Heringdorf et al., "Growth dynamics of pentacene thin films", *Nature,* vol. 412, Aug. 2001, pp. 517–520.
Swiggers et al., "Orientation of pentacene films using surface alignment layers and its influence on thin–film transistor characteristics", *Applied Physics Letters,* vol. 79, No. 9, Aug. 2001, pp. 1300–1302.
Kagan et al., "Patterning orgain–inorganic thin–film transistors using microcontact printed templates", Applied Physics Letters, vol. 79, No. 21, Nov. 2001, pp. 3536–3538.
Kelley et al., U.S. application Ser. No. 09/947,845, filed Sep. 6, 2001, entitled "Surface Modifying Layers for Organic Thin Film Transistors".

(List continued on next page.)

*Primary Examiner*—Sara Crane
(74) *Attorney, Agent, or Firm*—Kent S. Kokko

(57) ABSTRACT

Provided is an organic thin film transistor comprising a siloxane polymeric layer interposed between a gate dielectric and an organic semiconductor layer. An integrated circuit comprising thin film transistors and methods of making a thin film transistor are also provided. The organic thin film transistors of the invention typically exhibit improvement in one or more transistor properties.

31 Claims, No Drawings

OTHER PUBLICATIONS

Vogel et al., U.S. application Ser. No. 09/966,954, filed Sep. 27, 2001, entitled "Process for preparing Pentacene Derivatives".

Smith et al., U.S. application Ser. No. 09/966,961, filed Sep. 27, 2001, entitled "Substituted Pentacene Semiconductors".

* cited by examiner

ORGANIC THIN FILM TRANSISTOR WITH SILOXANE POLYMER INTERFACE

TECHNICAL FIELD

This invention relates to organic thin film transistors having improved performance. More particularly, the invention relates to organic thin film transistors having a siloxane polymeric layer between the semiconductor and gate dielectric and methods of making such transistors.

BACKGROUND

Organic semiconductors are of great interest for a variety of applications involving low-cost electronics. It is believed that organics can be synthesized to incorporate the necessary electronic properties for a wide variety of devices, and also can be constructed to allow low-cost, reel-to-reel processing that is not currently possible for crystalline silicon microelectronics.

One area of concern in organic electronic devices is the quality of the interface formed between the organic semiconductor and another device layer. Prior work on the interface between the semiconductor and the gate dielectric has included using silazane or silane coupling agents on silicon oxide surfaces. Silane coupling agents can require complex deposition processes.

EP 1041652 A2 describes the use of several surface treatments to enhance the crystalline domain size of solution-cast oligothiophenes on $SiO_x$ for thin film transistors (TFTs), although measured charge carrier mobility values were generally lower than the untreated controls. Other work involving surface treatments in TFTs involved poly(vinyl alcohol) layers, which may be relatively thick. In rare instances, previous work has shown minor improvements in mobility. The predominant effects shown in the previous work have been no improvement and/or detrimental effects on mobility, without regard for other important aspects of device performance.

SUMMARY

The present inventors discovered materials for and methods of improving the properties of organic thin film transistors by controlling the interface between the organic semiconductor and the dielectric material. The organic thin film transistors of the invention also are suitable for low-cost manufacturing processes.

The present invention provides a substantially nonfluorinated polymeric layer having a thickness less than about 400 Å interposed between a gate dielectric and an organic semiconductor layer in an OTFT. The polymeric layer comprises a polymer having interpolymerized units according to the formula:

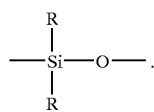

(I)

In this formula, each R comprises, independently, a group selected from hydrogen, $C_1$–$C_{20}$ aliphatic, $C_4$–$C_{20}$ alicyclic, arylalkyl, or aryl, and a combination thereof which may contain one or more heteroatom(s) and/or one or more functional group(s).

In another aspect, the present invention provides a method of making an OTFT comprising providing a substrate, forming a gate electrode on the substrate, forming a gate dielectric on the gate electrode, applying a substantially nonfluorinated polymeric layer having a thickness less than about 400 Å interposed between the gate dielectric and an organic semiconductor layer, depositing an organic semiconductor layer adjacent to the polymeric layer, and depositing a source electrode and a drain electrode contiguous to the organic semiconductor layer. An integrated circuit comprising OTFTs is also provided.

Any known thin film transistor construction option is possible with the invention. For example, the source and drain electrodes may be adjacent to the gate dielectric with the organic semiconductor layer over the source and drain electrodes, or the organic semiconductor layer may be interposed between the source and drain electrodes and the gate dielectric. In each option, the invention provides a siloxane polymeric layer between the organic semiconductor layer and the gate dielectric.

The present invention provides organic thin film transistors with one or more improvements over known devices. With the present invention, improvements in properties such as threshold voltage, subthreshold slope, on/off ratio, and charge-carrier mobility can be achieved. In addition, large improvements in at least one property, such as charge-carrier mobility, can be achieved with the invention, while maintaining other OTFT properties within desirable ranges. The improvements in device performance provided by the present invention enable the production by simpler processing conditions of complex circuits having higher operating speeds than an OTFT made without the polymer layer. This invention also enables the production of larger circuit elements having comparable performance to devices with very small features. Devices with larger feature sizes can be less expensive as they do not require expensive precision patterning methods.

As used herein, "a" or "an" or "the" are used interchangeably with "at least one", to mean "one or more" of the element being modified.

Other features and advantages of the invention will be apparent from the following detailed description of the invention and the claims. The above summary of principles of the disclosure is not intended to describe each illustrated embodiment or every implementation of the present disclosure. The detailed description that follows more particularly exemplifies certain preferred embodiments utilizing the principles disclosed herein.

DETAILED DESCRIPTION

Generally, a thin film transistor includes a gate electrode, a gate dielectric on the gate electrode, a source electrode and a drain electrode adjacent to the gate dielectric, and a semiconductor layer adjacent to the gate dielectric and adjacent to the source and drain electrodes. More specifically, an organic thin film transistor (OTFT) has an organic semiconductor layer. Such OTFTs are known in the art as shown, for example, in copending application U.S. Ser. No. 09/947,845, filed on Sep. 6, 2001, now U.S. Pat. No. 6,433,359, which is herein incorporated by reference.

The organic thin film transistor of the present invention further includes a siloxane polymeric layer interposed between the gate dielectric and the organic semiconductor layer.

Substrate

A substrate can be used to support the OTFT, e.g., during manufacturing, testing, storage, use, or any combination thereof. The gate electrode and/or gate dielectric may provide sufficient support for the intended use of the resultant OTFT and another substrate is not required. For example, doped silicon can function as the gate electrode and support the OTFT. In another example, one substrate may be selected for testing or screening various embodiments while another substrate is selected for commercial embodiments. In another embodiment, a support may be detachably adhered or mechanically affixed to a substrate, such as when the support is desired for a temporary purpose. For example, a flexible polymeric substrate may be adhered to a rigid glass support, which support could be removed. In some embodiments, the substrate does not provide any necessary electrical function for the OTFT. This type of substrate is termed a "non-participating substrate" in this document.

Useful substrate materials can include organic and/or inorganic materials. For example, the substrate may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP).

A flexible substrate is used in some embodiments of the present invention. This allows for roll processing, which may be continuous, providing economy of scale and economy of manufacturing over some flat and/or rigid substrates. The flexible substrate chosen preferably is capable of wrapping around the circumference of a cylinder of less than about 50 cm diameter without distorting or breaking. The substrate chosen more preferably is capable of wrapping around the circumference of a cylinder of less than about 25 cm diameter without distorting or breaking the substrate. In some embodiments, the substrate chosen most preferably is capable of wrapping around the circumference of a cylinder of less than about 10 cm diameter, or even about 5 cm diameter, without distorting or breaking the substrate. The force used to wrap the flexible substrate of the invention around a particular cylinder typically is low, such as by unassisted hand, i.e., without the aid of levers, machines, hydraulics, and the like. The preferred flexible substrate may be rolled upon itself.

Gate Electrode

The gate electrode can be any useful conductive material. For example, the gate electrode may comprise doped silicon, or a metal, such as aluminum, chromium, copper, gold, silver, nickel, palladium, platinum, tantalum, and titanium. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

Gate Dielectric

The gate dielectric is provided on the gate electrode, for example, through a deposition process. This gate dielectric electrically insulates the gate electrode under the operating conditions of the OTFT device from the balance of the device. Thus, the gate dielectric comprises an electrically insulating material. The gate dielectric should have a dielectric constant above about 2, more preferably above about 5. The dielectric constant of the gate dielectric also can be very high, for example, 80 to 100 or even higher. Useful materials for the gate dielectric may comprise, for example, an organic or inorganic electrically insulating material, or combinations thereof.

The gate dielectric may comprise a polymeric material, such as polyvinylidenefluoride (PVDF), cyanocelluloses, polyimides, epoxies, etc. In some embodiments, an inorganic capping layer comprises the outer layer of an otherwise polymeric gate dielectric for improved bonding to the polymeric layer and/or improved dielectric properties.

Specific examples of inorganic materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these can be used for the gate dielectric. Of these materials, aluminum oxides, silicon oxides, silicon nitrides, and zinc selenide are preferred.

The gate dielectric can be deposited in the OTFT as a separate layer, or formed on the gate such as by oxidizing, including anodizing, the gate material to form the gate dielectric.

Source and Drain Electrodes

The source electrode and drain electrode are separated from the gate electrode by the gate dielectric, while the organic semiconductor layer can be over or under the source electrode and drain electrode. The source and drain electrodes can be any useful conductive material. Useful materials include those materials described above for the gate electrode, for example, aluminum, barium, calcium, chromium, copper, gold, silver, nickel, palladium, platinum, titanium, polyaniline, PEDOT:PSS, other conducting polymers, alloys thereof, combinations thereof, and multilayers thereof.

The thin film electrodes (e.g., gate electrode, source electrode, and drain electrode) can be provided by any useful means such as physical vapor deposition (e.g., thermal evaporation, sputtering), plating, or ink jet printing. The patterning of these electrodes can be accomplished by known methods such as shadow masking, additive photolithography, subtractive photolithography, printing, transfer printing, microcontact printing, and pattern coating.

Organic Semiconductors

Useful materials for the organic semiconductor layer include acenes. Particular examples include anthracene, tetracene, pentacene, and substituted pentacenes. Substituted pentacene compounds that are useful as organic semiconductors in the present invention comprise at least one substituent selected from the group consisting of electron-donating substituents (for example, alkyl, alkoxy, or thioalkoxy), halogen substituents, and combinations thereof. Useful substituted pentacenes include but are not limited to 2,9-dialkylpentacenes and 2,10-dialkylpentacenes, wherein the alkyl group has from about 1 to 12 carbons; 2,10-dialkoxypentacenes; and 1,4,8,11-tetraalkoxypentacenes. Such substituted pentacenes are taught in copending applications U.S. Ser. No. 09/966,954, and U.S. Ser. No. 09/966,961, both filed on Sep. 26, 2001, which are herein incorporated by reference.

Examples of other useful organic semiconductors include perylenes, fullerenes, phthalocyanines, oligothiophenes, and substituted derivatives thereof. Particular organic semiconductor compounds include sexithiophene, $\alpha,\omega$-dihexylsexithiophene, quinquethiophene, quaterthiophene, $\alpha,\omega$-dihexylquaterthiophene, $\alpha,\omega$-dihexylquinquethiophene, poly(3-hexylthiophene), bis(dithienothiophene), anthradithiophene, dihexylanthradithiophene, polyacetylene, polythienylenevinylene, $C_{60}$, copper(II) hexadecafluorophthalocyanine, and N,N'-bis(pentadecafluoroheptylmethyl) naphthalene-1,4,5,8-tetracarboxylic diimide.

The organic semiconductor layer can be provided by any useful means, such as for example, vapor deposition, solution deposition, spin coating, and printing techniques.

Polymeric Layer

The polymeric layer of the invention has a maximum thickness less than about 400 Angstroms (Å), more preferably less than about 200 Å, most preferably less than about 100 Å. The polymeric layer of the invention generally has a thickness of at least about 5 Å, more preferably at least about 10 Å. The thickness can be determined through known methods, e.g., ellipsometry.

The polymeric layer comprises a substantially nonfluorinated polymer having interpolymerized units according to the formula:

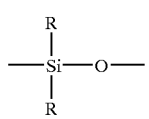
(I)

wherein each R comprises, independently, a group selected from hydrogen, $C_1$–$C_{20}$ aliphatic, $C_4$–$C_{20}$ alicyclic, arylalkyl, or aryl, and a combination thereof which may contain one or more heteroatom(s) and/or one or more functional group(s). As used in this document, "heteroatom" means a non-carbon atom such as O, P, S, N and Si. In this document, "substantially nonfluorinated" means that less than about 5% (more preferably less than about 1% and even more preferably 0%) of the carbons in the polymeric layer have fluorine substituents.

Particular selections for R groups include, for example, methyl, phenyl, 2-phenylethyl, $C_2$–$C_{18}$ aliphatic groups, and functional group-containing moieties including, but not limited to, hydroxyl, vinyl, 5-hexenyl, hydrogen, chloro, 3-(meth)acryloxypropyl, 3-mercaptopropyl, 3-glycidoxypropyl, 2-(3,4-epoxycyclohexyl)ethyl, 3-aminopropyl, 3-acetoxypropyl, 3-chloropropyl, 3-carboxypropyl, 3-cyanopropyl, chlorophenyl, $C_1$–$C_6$2-(dialkylphosphono)ethyl.

Examples of useful polymeric materials include poly(dimethylsiloxane), poly(dimethylsiloxane-co-diphenylsiloxane), poly(methylphenylsiloxane-co-diphenylsiloxane), and poly(dimethylsiloxane-co-methylphenylsiloxane).

Siloxane polymers useful in the practice of this invention may be prepared by any of a number of methods familiar to those skilled in the art, including, for example, anionic, condensation, or ring-opening polymerization. Siloxane polymers useful for this invention may also be prepared with the introduction of functional end-groups or functional pendant groups. This may be accomplished through the use of functional monomers, functional initiators, or functional chain terminators, for example, the termination of an anionically polymerized polydiorganosiloxane with a chlorotrialkoxysilane. They may also be prepared by modification of existing siloxane polymers, for example, the reaction of an olefinically functional polydiorganosiloxane with a silicon hydride, e.g., trichlorosilane.

While this invention emphasizes the use of linear polydiorganosiloxanes in which each unit in the siloxane polymer is derived from a difunctional precursor, it is considered within the scope of this invention to employ polyorganosiloxanes that incorporate small amounts of siloxane units derived from trifunctional or tetrafunctional precursors. The number of trifunctionally- and tetrafunctionally-derived siloxane units should not exceed about 10 percent, preferably about 5 percent or less, of the total average number of siloxane units in the polymer.

Useful polymeric materials may additionally include block copolymers comprising blocks of Formula (I) connected with blocks of interpolymerized units derived from an ethylenically unsaturated monomer such as styrene, butadiene, or isoprene.

In addition, blends of two or more polymeric or copolymeric materials may be used.

In another aspect, the OTFT of the invention incorporates a polymeric siloxane layer and has a charge carrier mobility at least 50% greater than the charge carrier mobility of a similar OTFT lacking the siloxane layer. In another aspect of the invention, the OTFT has a charge carrier mobility at least 0.02 $cm^2$/Vs, preferably at least 0.10 $cm^2$/Vs, more preferably at least 1.0 $cm^2$/Vs, greater than the charge carrier mobility of a similar OTFT lacking the polymeric layer. In this document, all charge carrier mobility values are room temperature values.

The polymeric layer is provided on the gate dielectric by any known method. For example, the polymeric layer can be provided through a coating process such as spray, spin, dip, knife, gravure, microcontact printing, ink jet printing, stamping, transfer printing, and vapor deposition. The polymeric layer can be provided on the gate dielectric via a solvent-based or solventless method. Presently preferred routes to the polymeric layer include solvent-based methods. When a solution of a polymeric layer precursor is provided on the gate dielectric layer, the solvent is removed by a method compatible with the materials involved, for example by heating.

In one embodiment, the source and drain electrodes are deposited adjacent to the gate dielectric before providing the polymeric layer. Then, the polymeric layer is applied. After the layer comprising a polymer is complete, the organic semiconductor layer is deposited over the source and drain electrodes and over the polymeric layer adjacent to the gate dielectric. Before deposition of the semiconductor, the material deposited on the gate dielectric to provide the polymeric layer may be rinsed so the source and drain electrodes are essentially free of the polymeric layer. That is, less than about 5 Å of polymeric layer, more preferably less than 1 Å and most preferably no polymeric layer, is present on the source and drain electrodes.

OTFT Methods

The present invention also provides a method of making a thin film transistor comprising the steps of: (a) providing a substrate; (b) depositing a gate electrode material on the substrate; (c) providing a gate dielectric on the gate electrode material; (d) applying a substantially nonfluorinated polymeric layer adjacent to the gate dielectric, the polymeric layer having a thickness less than about 400 Å; (e) providing an organic semiconductor layer adjacent to the polymeric layer; and (f) depositing a source electrode and a drain electrode contiguous to the organic semiconductor layer. The polymeric layer is selected from those described above, including combinations of two or more such polymeric layer materials. These steps can be performed in the order listed or in another order so long as the polymeric layer is interposed between the gate dielectric and the organic semiconductor layer. For example, the organic semiconductor layer can be provided over or under the source and drain electrodes.

Additional steps are useful in certain embodiments of the present invention. For example, rinsing may be performed after applying the polymeric layer. The polymeric layer may be applied via deposition of a polymer solution or a monomer solution which is then polymerized. The applied material may be exposed to an energy source, such as thermal radiation, UV or visible light, to remove solvent and/or crosslink the material to form the polymeric layer on the gate dielectric surface. Any combination of rinsing and/or energy-exposure may be used for particular embodiments, such as rinsing before or after heating, rinsing only, or heating without rinsing.

The present invention also provides an integrated circuit comprising a plurality of OTFTs made by the process described above and a method of making an integrated circuit comprising providing a plurality of OTFTs of the invention. Thus, the present invention is embodied in an article that comprises one or more of the OTFTs described. Such articles include, for example, radio-frequency identification tags, backplanes for active matrix displays, smart cards, memory devices, and the like. In devices containing the OTFTs of the present invention, such OTFTs are operatively connected by means known in the art.

The entire process of making the thin film transistor or integrated circuit of the present invention can be carried out below a maximum substrate temperature of about 450° C., preferably below about 250° C. A minimum substrate temperature of about 150° C. is preferred. The temperature selection generally depends on the substrate and processing parameters known in the art, once one is armed with the knowledge of the present invention contained herein. These temperatures are well below traditional integrated circuit and semiconductor processing temperatures, which enables the use of any of a variety of relatively inexpensive substrates, such as flexible polymeric substrates. Thus, the invention enables production of relatively inexpensive integrated circuits containing organic thin film transistors with significantly improved performance.

The OTFT of the present invention has one or more advantages over known organic thin film transistors. These advantages are apparent, for example, in charge-carrier mobility. The present invention provides OTFTs having a charge-carrier mobility greater than a comparison OTFT lacking the polymeric layer of the present invention. The OTFTs of the invention preferably have a charge-carrier mobility at least about 25% greater, more preferably at least about 50% greater, even more preferably at least about 75% greater, and in some embodiments at least about 100% greater, than the charge-carrier mobility of a comparison OTFT not made according to the present invention. Such improvements in charge-carrier mobility are provided while maintaining OTFT properties within desirable ranges. For example, the above-described improvements are obtained while providing a threshold voltage between about 25 and −25 V, a subthreshold slope below about 10 V/decade (absolute value), an on/off ratio of at least about $10^4$, and a charge-carrier mobility at least about $10^{-2}$ cm$^2$/Vs when the semiconductor layer comprises a p-type semiconductor or at least about $10^{-4}$ cm$^2$/Vs when the semiconductor layer comprises an n-type semiconductor. Various embodiments of the invention provide OTFTs with two, three, or more of these properties.

The invention provides a p-type semiconductor OTFT having a threshold voltage of between about −25 and 25 V, preferably a threshold voltage of between about 0 and −10 V, more preferably between about 0 and −5 V. The invention provides an n-type semiconductor OTFT having a threshold voltage of between about −25 and 25 V, preferably a threshold voltage of between about 10 and 0 V, more preferably between about 5 and 0 V. The invention provides an OTFT with a subthreshold slope below about 10 V/decade (absolute value), preferably a subthreshold slope below about 5 V/decade (absolute value), more preferably below about 2 V/decade (absolute value). The invention provides an OTFT with an on/off ratio of at least about $10^4$, preferably at least about $10^5$, more preferably at least about $5 \times 10^5$, and even more preferably at least about $10^6$.

More specifically, in an embodiment having pentacene or a substituted pentacene as the organic semiconductor, the invention provides an OTFT with a charge-carrier mobility at least about 0.1 cm$^2$/Vs, more preferably at least 0.2 cm$^2$/Vs, and even more preferably at least about 0.5 cm2/Vs. In some embodiments of the present invention, the charge-carrier mobility is above 1.0, or even above 2.0 cm$^2$/Vs. Particular embodiments of the present invention have shown a charge-carrier mobility greater than that reported for bulk single crystals of pentacene. In another embodiment of the invention, a pentacene OTFT has a charge-carrier mobility of at least about 2 cm$^2$/Vs, a negative threshold voltage, a subthreshold slope below about 3 V/decade, and an on/off ratio at least about $5 \times 10^5$.

Objects and advantages of this invention are further illustrated by the following examples, but the particular materials and amounts thereof recited in these examples, as well as other conditions and details, should not be construed to unduly limit this invention.

EXAMPLES

Test Methods

A. Film Thickness

Single wavelength ellipsometry was employed to obtain estimates of polymeric layer thickness. Substrate values of Psi and Delta ($\psi_s$ and $\Delta_s$) were obtained from the cleaned substrates (described below) at an angle of incidence of 70° and a wavelength of 632.8 nm using a Gaertner Dual Mode Automatic Ellipsometer, model L116A (Gaertner Co., Skokie, Ill.). The polymeric layer was applied to the substrates, and values were measured ($\psi_f$ and $\Delta_f$).

Ellipsometry modeling software, WVASE32 (from J. A. Woollam, Inc., Lincoln, Nebr.) was used to construct optical models appropriate to the specific polymer and substrate investigated. Material optical constants included with the program were used unless specified otherwise.

For thermal oxide on silicon substrates, the optical model consisted of 1000 Å of SiO$_2$ on 50 Å of an intermix layer (a Bruggeman effective medium approximation consisting of 50% SiO$_2$ and 50% Si) on top of a silicon substrate. The floating variables in the fit were the SiO$_2$ thickness, the intermix layer thickness and the intermix layer SiO2 percentage (where the Si percentage is adjusted to make up the balance of the interlayer composition). Typical fit values were 950–990 Å SiO$_2$, 40–60 Å intermix consisting of 20–60% SiO$^2$.

For alumina layers on silicon substrates, the optical model was 1500 Å of Al$_2$O$_3$ on Si. The floating variables in the fit were the thickness in Angstroms (d) and refractive index (n) of the Al$_2$O$_3$. Seed values of d=1500 and n=1.77 were used. Typical final fit values were between 1400 Å and 1700 Å with n between 1.56 and 1.60.

Once the substrate parameters were determined by modeling $\psi_s$ and $\Delta_s$, they were fixed and a polymer layer was added to the optical model, between the air and dielectric layers. This layer had a variable thickness, but its refractive index was fixed at a value typical of that polymer in its bulk state. The refractive index of copolymer samples was estimated. The polymeric layer thickness was then varied to achieve the best fit to $\psi_f$ and $\Delta_f$. Each thickness reported in Table 1 (below) was the average of four measurements on each sample.

B. Water Contact Angle (WCA)

Static, advancing, and receding water contact angles were measured with a video contact angle apparatus (Model VCA-2500XE, from AST Products, Billerica, Mass.). Values reported were averages of measurements on both sides of at least three drops on each tested surface. Estimated uncertainties in these measurements were +/−1 degree in static and advancing measurements and +/−2 degrees in receding measurements. Surface characterization data are summarized in Table 1 (below).

C. Thin Film Transistor Performance

Transistor performance was tested at room temperature in air using techniques known in the art, for example as shown in S. M. Sze, *Physics of Semiconductor Devices*, page 442, John Wiley & Sons, New York, 1981, which is herein incorporated by reference. A Semiconductor Parameter Analyzer (model 4145A from Hewlett-Packard, Palo Alto, Calif.) was used to obtain the results below.

The square root of the drain current ($I_d$) was plotted as a function of gate-source bias ($V_g$), from +10V to −40V for a constant source-drain bias ($V_d$) of −40V, and the saturation field effect mobility was calculated from the straight line portion of the curve using the specific capacitance of the gate dielectric, the channel width and the channel length. The x-axis extrapolation of this straight-line fit was taken as the threshold voltage ($V_t$). In addition, plotting $I_d$ as a function of $V_g$ yielded a curve where a straight line fit was drawn along a portion of the curve containing $V_t$. The inverse of the slope of this line was the subthreshold slope (S). The on-off ratio was taken as the difference between the minimum and maximum drain current ($I_d$) values of the $I_d$-$V_g$ curve.

Substrates

Single crystal <100> orientation heavily-doped silicon wafers were obtained from Silicon Valley Microelectronics, San Jose, Calif. A 1500 Å layer of alumina (Wafer A), or a 1000 Å layer of high temperature thermal silicon oxide (Wafer B) was deposited on each wafer front via chemical vapor deposition methods. A 5000 Å layer of aluminum metal was vapor deposited onto the backside of each wafer. In this demonstration, the doped wafer capped with aluminum served as the gate electrode and the aluminum oxide or silicon oxide functioned as the gate dielectric when organic thin film transistors were prepared.

Wafer Preparation and Polymer Coating Procedure

Wafer substrates were quartered and cleaned by 5 min exposure in a UV/ozone chamber. The material of choice was applied by spin coating (300 rpm/5 s then 2000 rpm/15 s) a solution in toluene of the polymer named in the particular example and baked at 200° C. for 30 minutes, then rinsed with toluene. Ellipsometric film thickness and water contact angles were measured using the procedures outlined above.

Semiconductor Coating Procedure

Pentacene (available from Aldrich Chemical) was purified in a 3-zone furnace (Thermolyne 79500 tube furnace, from Barnstead Thermolyne, Dubuque, Iowa) at reduced pressure under a constant flow of nitrogen gas.

The purified pentacene was deposited by sublimation under vacuum (approximately $10^{-6}$ Torr (or $1.33 \times 10^{-4}$ Pa)) onto the polymeric surface at a rate of 0.5 Å per second to reach thickness of 500 Å as measured by a quartz crystal microbalance. Palladium or gold source and drain electrodes were then shadow masked onto the pentacene layer. The device dimensions were 40 μm to 60 μm channel length× 1000 μm channel width.

Final Steps for Device Preparation and Testing

Multiple OTFTs were prepared and a representative sample of at least six OTFTs was tested for each of at least two deposition runs. The averaged results appear below in Table 2.

Examples 1–2

Wafers were quartered and solvent cleaned and then further cleaned using the procedure described above. Poly (dimethylsiloxane) (50 cSt viscosity, available as Dow Corning 200® fluid from Dow Corning, Midland, Mich.) was dissolved in toluene to reach a 1.0 wt % solution, which was applied to samples of Wafer A (Example 1) and Wafer B (Example 2). The solutions were applied via the Polymer Coating Procedure. Pentacene was applied as described above. OTFTs were prepared and tested as described above. Results are shown in Tables 1 and 2 below.

Example 3

Poly(dimethylsiloxane-co-diphenylsiloxane) (5% diphenylsiloxane, CR524B, from General Electric Silicones, Waterford, N.Y.) was dissolved in toluene to make a 0.15 wt % solution. This solution was applied via the Polymer Coating Procedure described above onto Wafer A samples. Pentacene was applied as described above. OTFTs were prepared and tested as described above. Results are shown in Tables 1 and 2 below.

Example 4

Poly(dimethylsiloxane-co-methylphenylsiloxane) (viscosity 50 cSt, available as Dow Corning 510®) was dissolved in toluene to form a 1.0 wt % solution and applied via the Polymer Coating Procedure described above onto Wafer B samples. Pentacene was applied as described above. OTFTs were prepared and tested as described above. Results are shown in Tables 1 and 2 below.

Comparative Examples 1–2 (CE1 and CE2)

Wafers were quartered and cleaned immediately before use using consecutive rinses in acetone, methanol, 2-propanol and water, baked on a hot plate at 100° C. for 3 minutes and exposed to UV/ozone in a home built chamber for 15 minutes. Wafer A was used for CE1, and Wafer B was used for CE2. Pentacene was applied as described above. OTFTs were prepared and tested as described above. Results are shown in Tables 1 and 2 below.

TABLE 1

Thickness and Water Contact Angles (WCA)

| Ex. | Thickness (Å) | Advancing WCA | Static WCA | Receding WCA |
|---|---|---|---|---|
| 1 | 10 | 106 | 97 | 66 |
| 2 | 13 | 92 | 87 | 62 |
| 3 | 26 | 112 | 105 | 96 |
| 4 | 13 | 91 | 84 | 63 |
| CE1 | N/A | <20 | <20 | <20 |
| CE2 | N/A | <20 | <20 | <20 |

TABLE 2

OTFT Performance

| Ex. | Mobility (cm$^2$/Vs) | Threshold Voltage (V) | Sub-threshold Slope (V/decade) | On/Off Ratio |
|---|---|---|---|---|
| 1 | 2.2 | −1.1 | 1.3 | 4.6 × 10$^6$ |
| 2 | 1.5 | −4.4 | 1.8 | 2.2 × 10$^6$ |
| 3 | 1.1 | −1.5 | 1.5 | 2.5 × 10$^7$ |
| 4 | 1.9 | −5.7 | 1.2 | 2.4 × 10$^7$ |
| CE1 | 0.98 | −6.7 | 1.7 | 1.9 × 10$^7$ |
| CE2 | 0.30 | −8.5 | 4.1 | 1.7 × 10$^5$ |

Various modifications and alterations of this invention will be apparent to those skilled in view of the foregoing description, without departing from the scope and principles of this invention. Accordingly, it should be understood that this invention is not to be unduly limited to the illustrative embodiments set forth hereinabove.

We claim:

1. An organic thin film transistor (OTFT) comprising a substantially nonfluorinated polymeric layer having a thickness less than about 400 Å interposed between a gate dielectric and an organic semiconductor layer, wherein the polymeric layer comprises a polymer having interpolymerized units according to the formula:

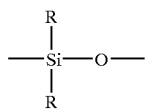

(I)

wherein each R comprises, independently, a group selected from hydrogen, C$_1$–C$_{20}$ aliphatic, C$_4$–C$_{20}$ alicyclic, arylalkyl, or aryl, and a combination thereof which may contain one or more heteroatom(s) and/or one or more functional group(s).

2. The transistor of claim 1 wherein the polymeric layer comprises poly(dimethylsiloxane), poly(dimethylsiloxane-co-diphenylsiloxane), poly(methylphenylsiloxane-co-diphenylsiloxane), or poly(dimethylsiloxane-co-methylphenylsiloxane).

3. The transistor of claim 1 wherein the polymeric layer further comprises blocks of interpolymerized units derived from an ethylenically unsaturated monomer.

4. The transistor of claim 1 wherein R comprises a group selected from methyl, vinyl, 5-hexenyl, phenyl, 2-phenylethyl, 3-(meth)acryloxypropyl, 3-mercaptopropyl, 3-glycidoxypropyl, 2-(3,4-epoxycyclohexyl)ethyl, 3-aminopropyl, 3-acetoxypropyl, 3-chloropropyl, 3-carboxypropyl, 3-cyanopropyl, and 2-(diethylphosphono)ethyl.

5. The transistor of claim 1 having at least one property selected from
 a) a threshold voltage between about −25 and 25 volts;
 b) a subthreshold slope below about 10 volts per decade (absolute value);
 c) an on/off ratio of at least about 10$^4$;
 d) a charge-carrier mobility at least about 10$^{-2}$ cm$^2$/Vs when the semiconductor layer comprises a p-type semiconductor;
 e) a charge-carrier mobility at least about 10$^{-4}$ cm$^2$/Vs when the semiconductor layer comprises an n-type semiconductor;
 f) a charge-carrier mobility at least about 50% greater than a comparison OTFT that lacks the polymeric layer;
 g) a charge-carrier mobility at least about 0.02 cm$^2$/Vs greater than a comparison OTFT that lacks the polymeric layer;
 h) a charge-carrier mobility at least about 0.10 cm$^2$/Vs greater than a comparison OTFT that lacks the polymeric layer; and
 i) a charge-carrier mobility at least about 1.0 cm$^2$/Vs greater than a comparison OTFT that lacks the polymeric layer.

6. The transistor of claim 5 having at least two of the properties listed.

7. The transistor of claim 5 having at least three of the properties listed.

8. The transistor of claim 5 wherein the semiconductor layer comprises pentacene or a substituted pentacene and wherein the transistor has a charge-carrier mobility at least about 10$^{-1}$ cm$^2$/Vs.

9. The transistor of claim 5 having a charge-carrier mobility at least about 100% greater than a comparison OTFT that lacks the polymeric layer.

10. The transistor of claim 1 comprising a gate dielectric that comprises an organic electrically insulating material, optionally capped with an inorganic electrically insulating material.

11. The transistor of claim 1 comprising a gate dielectric that comprises an inorganic electrically insulating material selected from strontiates, tantalates, titanates, zirconates, aluminum oxides, silicon oxides, tantalum oxides, titanium oxides, silicon nitrides, barium titanate, barium strontium titanate, barium zirconate titanate, zinc selenide, zinc sulfide, and alloys, combinations, and multilayers thereof.

12. The transistor of claim 1 further comprising a non-participating substrate.

13. The transistor of claim 12 where in the non-participating substrate is selected from inorganic glasses, ceramic foils, polymeric materials, filled polymeric materials, coated metallic foils, acrylics, epoxies, polyamides, polycarbonates, polyimides, polyketones, poly(ether ether ketone), polynorbornenes, polyphenyleneoxides, poly(ethylene naphthalenedicarboxylate), poly(ethylene terephthalate), poly(phenylene sulfide), and fiber-reinforced plastics.

14. The transistor of claim 12 wherein the non-participating substrate is flexible.

15. The transistor of claim 14 wherein the flexible substrate is capable of wrapping around the circumference of an about 10 cm diameter cylinder without breaking the substrate.

16. The transistor of claim 1 comprising gate, source, and drain electrodes, each independently comprising a material selected from doped silicon, metal, a conducting polymer, and combinations thereof.

17. The transistor of claim 16 wherein the gate electrode comprises a material selected from aluminum, chromium, copper, gold, silver, nickel, palladium, platinum, tantalum, titanium, polyaniline, poly(3,4-oxyethylenedioxythiophene)/poly(styrene sulfonate), alloys thereof, combinations thereof, and multilayers thereof.

18. The transistor of claim 16 wherein the source and/or drain electrode(s) are selected from aluminum, barium, calcium, chromium, copper, gold, silver, nickel, palladium, platinum, titanium, polyaniline, poly(3,4-ethylenedioxythiophene)/poly(styrene sulfonate), alloys thereof, combinations thereof, and multilayers thereof.

19. The transistor of claim 1 wherein the organic semiconductor layer comprises a material selected from acenes, perylenes, fullerenes, phthalocyanines, and oligothiophenes.

20. The transistor of claim 1 wherein the organic semiconductor layer comprises a vapor-deposited organic semiconductor.

21. The transistor of claim 1 wherein the organic semiconductor layer comprises anthracene, tetracene, pentacene, a substituted pentacene, copper(II) hexadecafluorophthalocyanine, or sexithiophene.

22. An integrated circuit comprising a multiplicity of the transistors according to claim 1.

23. A method of making an organic thin film transistor comprising:
 a) providing a substrate;
 b) depositing a gate electrode material on the substrate;
 c) depositing a gate dielectric on the gate electrode material;
 d) applying a substantially nonfluorinated siloxane polymeric layer having a thickness less than about 400 Å interposed between a gate dielectric and an organic semiconductor layer, wherein the polymeric layer comprises a polymer having interpolymerized units according to the formula:

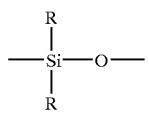
(I)

wherein each R comprises, independently, a group selected from hydrogen, $C_1$–$C_{20}$ aliphatic, $C_4$–$C_{20}$ alicyclic, arylalkyl, or aryl, and a combination thereof which may contain one or more heteroatom(s) and/or one or more functional group(s);
 e) depositing an organic semiconductor layer adjacent to the polymeric layer; and
 f) providing a source electrode and a drain electrode contiguous to the organic semiconductor layer.

24. The method of claim 23 wherein the steps are performed in the order listed.

25. The method of claim 23 further comprising rinsing the layered material of step (d), before or after optionally exposing the material to an energy source.

26. The method of claim 23 wherein the step of providing a polymeric layer involves a coating process selected from spray, spin, dip, knife, gravure, microcontact printing, ink jet printing, stamping, transfer printing, and vapor deposition.

27. The method of claim 23 wherein the source and drain electrodes are provided adjacent to the gate dielectric before the step of providing a polymeric layer on the gate dielectric.

28. The method of claim 23 further comprising rinsing the siloxane polymeric layer from any surface other than the dielectric material.

29. The method of claim 23 wherein the substrate is flexible.

30. The method of claim 23 carried out in its entirety below a peak substrate temperature of 250° C.

31. The method of claim 23 carried out on a web.

* * * * *

UNITED STATES PATENT AND TRADEMARK OFFICE
CERTIFICATE OF CORRECTION

PATENT NO. : 6,617,609 B2
DATED : September 9, 2003
INVENTOR(S) : Kelley, Tommie W.

It is certified that error appears in the above-identified patent and that said Letters Patent is hereby corrected as shown below:

Title page,
Item [56], References Cited, OTHER PUBLICATIONS, "Rogers et al." reference, delete "Plasic" and insert in place thereof -- Plastic --.

Column 3,
Line 22, delete "polynorbomenes" and insert in place thereof -- polynorbornenes --.

Column 10,
Line 37, delete "Coming" and insert in place thereof -- Corning --.

Column 11,
Line 16, after "in" insert -- the art in --.

Signed and Sealed this

Fifth Day of April, 2005

JON W. DUDAS
*Director of the United States Patent and Trademark Office*